United States Patent
Xu (10) Patent No.: US 11,862,965 B2
(45) Date of Patent: Jan. 2, 2024

(54) ELECTROSTATIC DISCHARGE PROTECTION CIRCUIT

(71) Applicant: CHANGXIN MEMORY TECHNOLOGIES, INC., Hefei (CN)

(72) Inventor: Qi'an Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/664,910

(22) Filed: May 25, 2022

(65) Prior Publication Data

US 2023/0283068 A1 Sep. 7, 2023

Related U.S. Application Data

(63) Continuation of application No. PCT/CN2022/081549, filed on Mar. 17, 2022.

(30) Foreign Application Priority Data

Mar. 7, 2022 (CN) .......................... 202210224399.6

(51) Int. Cl.
*H02H 9/02* (2006.01)
*H02H 9/00* (2006.01)

(52) U.S. Cl.
CPC .............. *H02H 9/005* (2013.01); *H02H 9/00* (2013.01); *H02H 9/02* (2013.01)

(58) Field of Classification Search
CPC ............ H02H 9/00; H02H 9/044; H02H 9/04; H02H 9/046; H02H 9/002; H02H 9/041;
(Continued)

(56) References Cited

U.S. PATENT DOCUMENTS 6,249,410 B1 6/2001 Ker et al.
6,912,109 B1 * 6/2005 Ker ..................... H01L 27/0266
361/111
(Continued)

FOREIGN PATENT DOCUMENTS

CN 101494376 A 7/2009
CN 113097206 A 7/2021
CN 114121931 A 3/2022

OTHER PUBLICATIONS

International Search Report cited in PCT/CN2022/081549 dated Nov. 25, 2022, 8 pages.

*Primary Examiner* — Danny Nguyen
(74) *Attorney, Agent, or Firm* — Cooper Legal Group, LLC (57) ABSTRACT

The present disclosure provides an electrostatic discharge protection circuit, a chip including a first pad and a second pad. The electrostatic discharge protection circuit includes a trigger unit and a discharge transistor. The trigger unit is connected between the first pad and the second pad, provided with a trigger terminal, and configured to generate a trigger signal when there is an electrostatic pulse on the first pad. The first pad is connected to a first voltage, the second pad is connected to a second voltage, and the first voltage is greater than the second voltage. The discharge transistor has a first terminal connected to the first pad, and a second terminal connected to the second pad, and discharges an electrostatic charge to the second pad when triggered by the trigger signal.

9 Claims, 8 Drawing Sheets

(58) Field of Classification Search
CPC ....... H02H 9/02; H01L 24/02; H01L 27/0288;
H01L 27/0251; H05K 9/0067
USPC .......................................................... 361/56
See application file for complete search history.

(56) References Cited

U.S. PATENT DOCUMENTS

| | | | |
|---|---|---|---|
| 7,911,748 B1* | 3/2011 | Chu | H01L 27/0266 |
| | | | 361/11 |
| 2001/0007521 A1 | 7/2001 | Chen | |
| 2006/0050451 A1* | 3/2006 | Jen-Chou | H02H 9/046 |
| | | | 361/56 |
| 2006/0087781 A1* | 4/2006 | Ishizuka | H01L 27/0251 |
| | | | 361/56 |
| 2009/0086392 A1* | 4/2009 | Ker | H02H 9/046 |
| | | | 361/56 |
| 2018/0019741 A1* | 1/2018 | Huang | H03K 17/0822 |
| 2019/0319453 A1* | 10/2019 | Sithanandam | H01L 27/0266 |
| 2022/0068763 A1 | 3/2022 | Li et al. | |

* cited by examiner

ELECTROSTATIC DISCHARGE PROTECTION CIRCUIT

CROSS-REFERENCE TO RELATED APPLICATIONS

This is a continuation of International Application No. PCT/CN2022/081549, filed on Mar. 17, 2022, which claims the priority to Chinese Patent Application No. 202210224399.6, titled "ELECTROSTATIC DISCHARGE PROTECTION CIRCUIT" and filed with China National Intellectual Property Administration (CNIPA) on Mar. 7, 2022. The entire contents of International Application No. PCT/CN2022/081549 and Chinese Patent Application No. 202210224399.6 are incorporated herein by reference.

TECHNICAL FIELD

The present disclosure relates to, but is not limited to, an electrostatic discharge protection circuit.

Background

Static electricity is everywhere. Without an electrostatic discharge (ESD) protection circuit, a chip will soon be damaged, and almost fatally damaged, by static electricity introduced due to various reasons. Therefore, a chip is usually provided with an ESD protection circuit, and the ESD protection circuit is used to discharge electrostatic charges in a timely manner, to prevent a protected circuit from failing or even burning due to a high voltage caused by the electrostatic charges.

However, the existing ESD protection circuit is prone to a latch-up effect, affecting chip performance.

SUMMARY

An embodiment of the present disclosure provides an ESD protection circuit, a chip including a first pad and a second pad, where the ESD protection circuit includes: a trigger unit, connected between the first pad and the second pad, provided with a trigger terminal, and configured to generate a trigger signal when there is an electrostatic pulse on the first pad, where the first pad is connected to a first voltage, the second pad is connected to a second voltage, and the first voltage is greater than the second voltage; and a discharge transistor, having a control terminal connected to the trigger terminal, a first terminal connected to the first pad, and a second terminal connected to the second pad, and configured to discharge an electrostatic charge to the second pad when triggered the trigger signal, to pull a voltage at a substrate terminal of the discharge transistor to the first voltage or the second voltage.

DETAILED DESCRIPTION

Exemplary embodiments are described in detail herein, and examples thereof are represented in the accompanying drawings. When the following descriptions relate to the accompanying drawings, unless otherwise stated, same digitals in different accompanying drawings represent same or similar essential factors. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

Those skilled in the art may easily figure out other implementations of the present disclosure after considering the specification and practicing the application disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. This specification and embodiments are merely considered as illustrative, and the real scope and spirit of the present disclosure are defined by the appended claims.

A latch-up effect means that a parasitic thyristor structure (Silicon Controlled Rectifier, SCR) in a CMOS circuit is triggered and turned on, creating a low resistance path between a power supply (power VDD/VPP) and a ground wire (GND/VSS), and causing the circuit to fail to work properly and even burning a chip.

Figure 1:
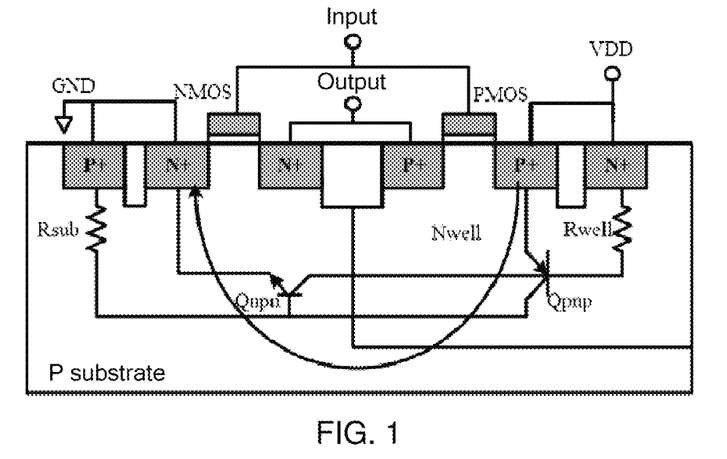
FIG. 1 is a schematic cross-sectional view of a semiconductor structure.
Figure 2:
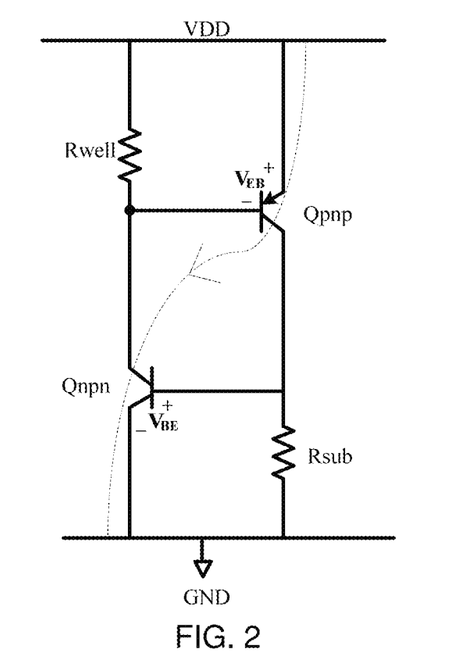
FIG. 2 is an equivalent circuit diagram of a parasitic transistor in the semiconductor structure.

Referring to FIG. 1 and FIG. 2, FIG. 1 is a schematic cross-sectional view of a semiconductor structure, and FIG. 2 is an equivalent circuit diagram of a parasitic transistor in the semiconductor structure. In FIG. 1, a source-drain region of an NMOS, a P substrate, and an N-well constitute a parasite NPN transistor, and a source-drain region of a PMOS, an N-well, and a P substrate constitute a parasite PNP transistor. For the parasite NPN transistor, the source-drain region of the NMOS constitutes an emission region thereof, the P substrate constitutes a base region thereof, and the N-well constitutes a collector region thereof. For the parasite PNP transistor, the source-drain region of the PMOS constitutes an emission region thereof, the N-well constitutes a base region thereof, and the P substrate constitutes a collector region thereof. In addition, there is a well resistor Rwell between the N-well and the power supply VDD, and there is a substrate resistor Rsub between the P substrate and the ground wire GND.

Under normal circumstances, the parasite NPN transistor and the parasite PNP transistor are cut off, and no latch-up effect is caused. However, as shown in FIG. 1 and FIG. 2, when subjected to external interference, a voltage drop of the well resistor Rwell is greater than a turn-on voltage of the parasite PNP transistor, and the parasite PNP transistor is turned on, such that a current flows through the substrate a resistor Rsub, a voltage drop of the substrate resistor Rsub is greater than a turn-on voltage of the parasite NPN transistor, and the parasite NPN transistor is turned on. In this way, a large current flows through the well resistor Rwell, and the voltage drop of the well resistor Rwell is increased, such that the parasite PNP transistor is further turned on, thus forming a positive feedback amplification loop, to amplify the current continuously. Consequently, an extremely large turn-on current is formed between the power supply and the ground wire, burning the chip.

Figure 3:
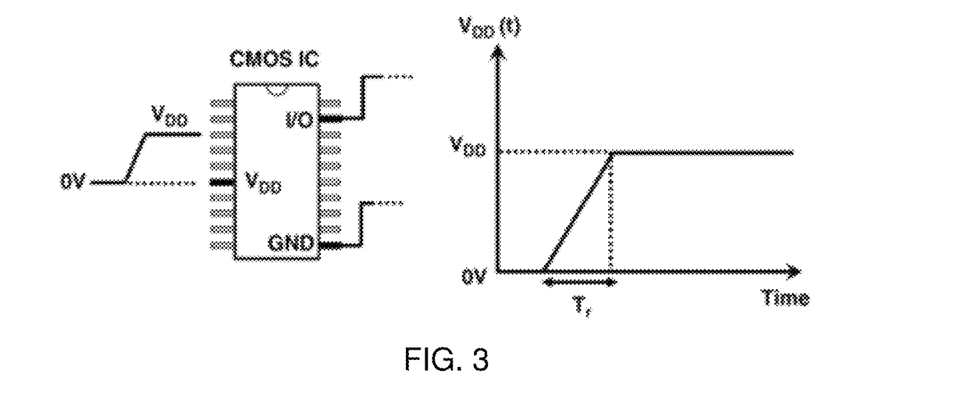
FIG. 3 to FIG. 5 are each a schematic diagram of a reason for latching.
Figure 4:
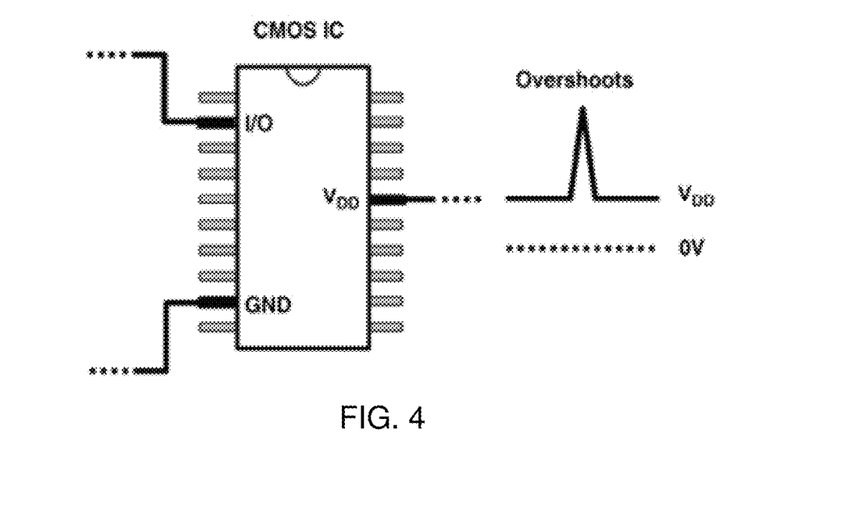
Figure 5:
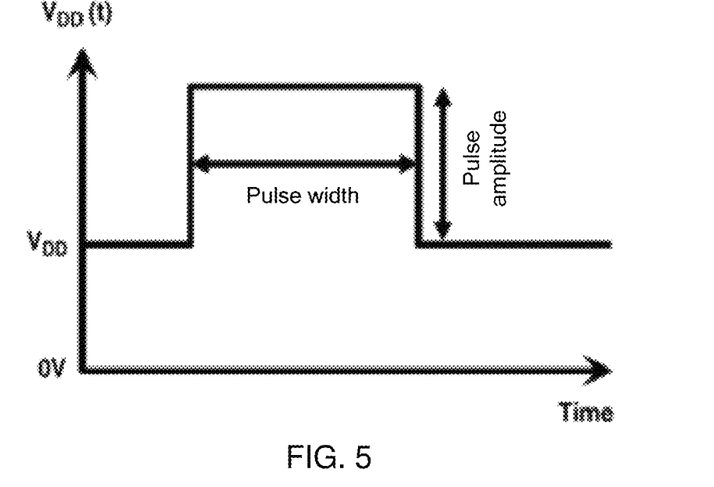

The external interference may be, for example, as shown in FIG. 3, a case that when the chip starts to work, a parasitic capacitor between the N-well and the P substrate generates enough current due to a change in the power supply VDD, causing a latch-up effect. Further, alternatively, referring to FIG. 4, noise coupling under environmental or system interference causes the power supply VDD to overshoot, resulting in triggering of a parasitic transistor. Further, alternatively, referring to FIG. 5, during a latch-up test, a relatively large voltage is applied to an ESD protection circuit, causing a small amount of charged carriers in a protection circuit to enter a substrate, resulting in triggering of a parasitic transistor.

Figure 6:
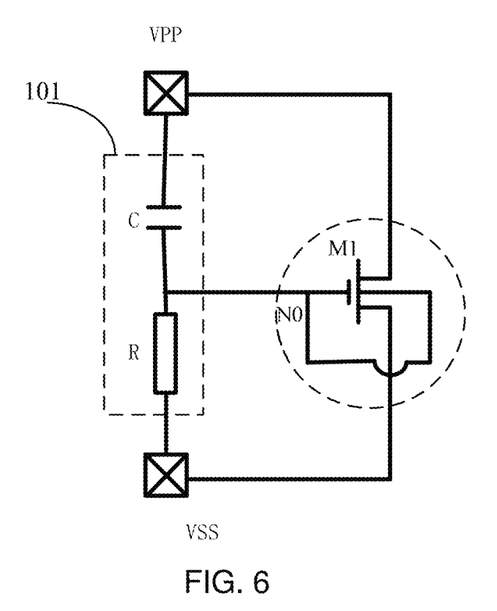
FIG. 6 is a specific circuit diagram of an ESD protection circuit according to an embodiment of the present disclosure.
Figure 7:
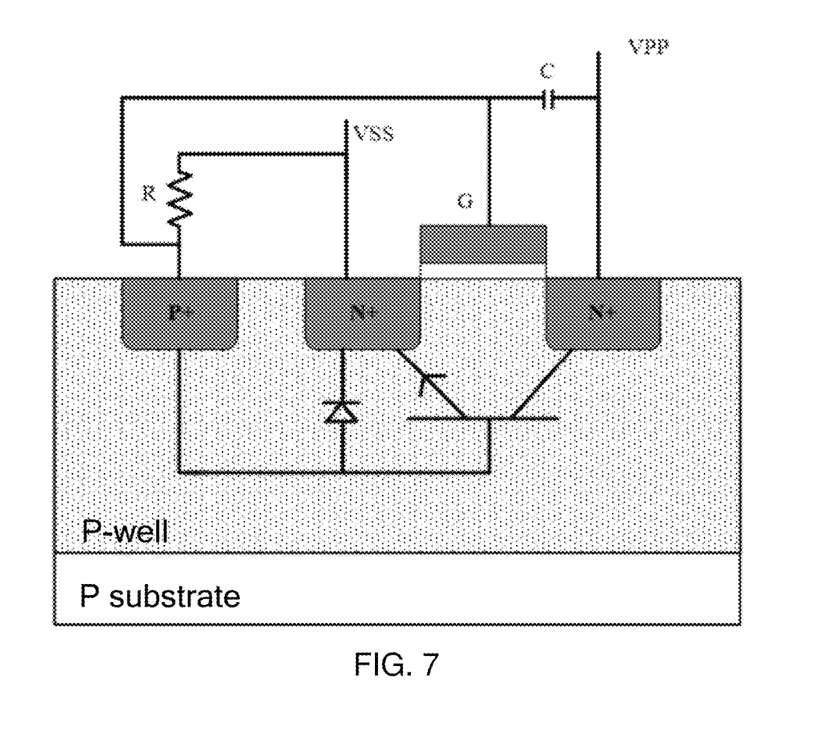
FIG. 7 is a semiconductor structure diagram of the ESD protection circuit according to the embodiment shown in FIG. 6.

FIG. 6 is a circuit diagram of an ESD protection circuit according to an embodiment of the present disclosure. FIG. 7 is a semiconductor structure diagram of the ESD protection circuit according to the embodiment shown in FIG. 6. As shown in FIG. 6 and FIG. 7, a chip includes a first pad VPP and a second pad VSS, and the ESD protection circuit includes a trigger unit 101 and a discharge transistor M1.

The trigger unit 101 is provided with a trigger terminal NO. The trigger terminal NO of the trigger unit 101 is connected to a control terminal NO of the discharge transistor M1. The trigger unit 101 is located between the first pad VPP and the second pad VSS. The discharge transistor M1 is further provided with a first terminal, a second terminal, and a substrate terminal. The first terminal of the discharge transistor M1 is connected to the first pad VPP, the second terminal of the discharge transistor M1 is connected to the second pad VSS, and the substrate terminal of the discharge transistor M1 is also connected to the trigger terminal NO. The trigger unit 101 generates a trigger signal when detecting an electrostatic pulse. The discharge transistor M1 is turned on under the trigger of the trigger signal, to discharge an electrostatic charge from the first pad VPP to the second pad VSS.

Referring to FIG. 7, when the discharge transistor M1 is an N-type transistor, the discharge transistor M1 also includes a parasite NPN transistor and a parasite PN diode.

A base of the parasite NPN transistor is the substrate terminal of the discharge transistor M1. A collector of the parasite NPN transistor is a drain of the discharge transistor M1.

An emitter of the parasite NPN transistor is a source of the discharge transistor M1. An anode of the parasite PN diode is the substrate terminal of the discharge transistor M1. A cathode of the parasite PN diode is the source of the discharge transistor M1.

For example, during a latching test, a relatively large voltage, for example, a voltage of 1.5 times VPP, is applied to the first pad VPP, such that a drain region undergoes ionization (impact ionization), and a resulting hole enters the substrate and flows into the second pad VSS through the resistor R, thereby raising a potential of the substrate. When the potential of the substrate is high enough to cause the parasite PN diode formed by the substrate and the source to be turned on forward (PN diode forward turn on), a voltage at a base of the parasite NPN transistor is also raised, such that the parasite NPN transistor is turned on, thereby forming a low resistance path between the first pad VPP and the second pad VSS. In addition, because a gate of the discharge transistor M1 and the substrate are connected (short), a potential of the gate increases with the increase of the potential of the substrate, which in turn causes the parasite NPN transistor to be turned on. When a holding voltage of the discharge transistor M1 is less than VPP, the discharge transistor M1 enters a latch-up state, causing an electric leakage.

An embodiment of the present disclosure provides an ESD protection circuit, referring to FIG. 8 to FIG. 15, with a chip including a first pad VPP and a second pad VSS. The ESD protection circuit includes a trigger unit 101 and a discharge transistor M1. The trigger unit 101 is connected between the first pad VPP and the second pad VSS.

The first pad VPP is connected to a first voltage. The second pad VSS is connected to a second voltage. The first voltage is greater than the second voltage, that is, a voltage of the first pad VPP is higher than a voltage of the second pad VSS. The first pad VPP may be connected to an input unit to obtain the first voltage through the input unit. The trigger unit 101 is provided with a trigger terminal NO. A control terminal NO of the discharge transistor M1 is connected to the trigger terminal NO of the trigger unit 101. A first terminal of the discharge transistor M1 is connected to the first pad VPP. A second terminal of the discharge transistor M1 is connected to the second pad VSS.

Figure 8:
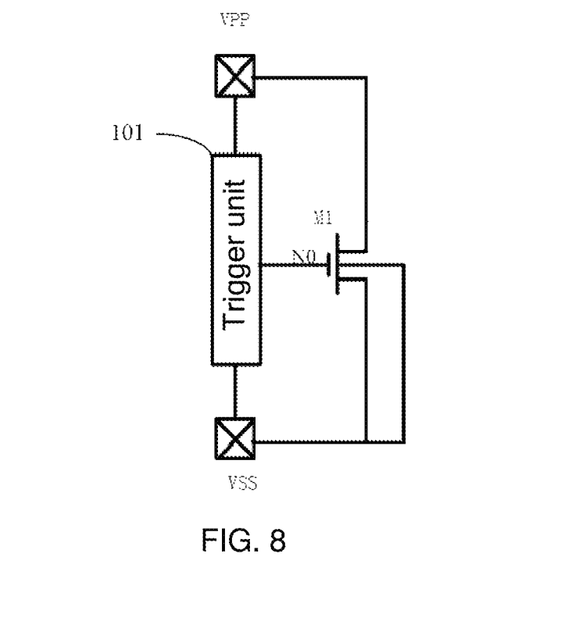
FIG. 8 is a specific circuit diagram of an ESD protection circuit according to another embodiment of the present disclosure.

The trigger unit 101 generates a trigger signal when detecting an electrostatic pulse on the first pad VPP. The discharge transistor M1 is turned on under the trigger of the trigger signal, to discharge an electrostatic charge to the second pad VSS, and a voltage at a substrate terminal of the discharge transistor M1 is pulled to the first voltage or the second voltage, making it difficult for a parasite NPN transistor in the discharge transistor M1 to be turned on, thereby effectively reducing the risk of causing a latch-up effect. FIG. 8 is a circuit diagram of an ESD protection circuit according to an embodiment of the present disclosure. As shown in FIG. 8, the ESD protection circuit provided in this embodiment of the present disclosure includes a trigger unit 101 and a discharge transistor M1, and the discharge transistor M1 is an N-type transistor.

The trigger unit 101 is provided with a trigger terminal NO. The discharge transistor M1 is provided with a control terminal NO, a first terminal, a second terminal, and a substrate terminal. The control terminal NO of the discharge transistor M1 is connected to the trigger terminal NO of the trigger unit 101. The first terminal of the discharge transistor M1 is connected to a first pad VPP. The second terminal of the discharge transistor M1 is connected to a second pad VSS. The substrate terminal of the discharge transistor M1 is connected to the second pad VSS.

When there is an electrostatic pulse on the first pad VPP, a voltage at the trigger terminal NO of the trigger unit 101 is raised, and because the control terminal NO of the discharge transistor M1 is connected to the trigger terminal NO of the trigger unit 101, a voltage at the control terminal NO of the discharge transistor M1 is raised. In this way, the discharge transistor M1 is turned on, and discharges an electrostatic charge to the second pad VSS. In addition, because there is an electrostatic pulse on the first pad VPP, an increase in a potential of a substrate easily causes a latch-up effect. The substrate terminal of the discharge transistor M1 is connected to the second pad VSS, and therefore, a voltage at the substrate terminal is pulled down to a second voltage. The voltage at the substrate terminal is reduced to reduce a voltage at a base of a parasite NPN transistor, making it difficult for the parasite NPN transistor to be turned on, thereby effectively reducing the risk of causing a latch-up effect.

Figure 9:
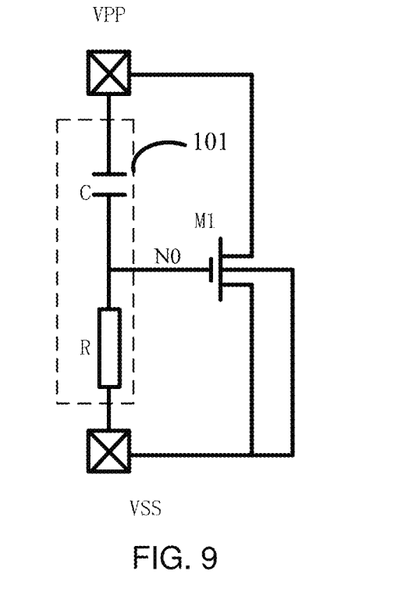
FIG. 9 is a specific circuit diagram of the ESD protection circuit according to the embodiment shown in FIG. 8.

In some embodiments, as shown in FIG. 9, the trigger unit 101 includes a trigger capacitor C and a trigger resistor R. The trigger capacitor C and the trigger resistor R are each provided with a first terminal and a second terminal. The first terminal of the trigger capacitor C is connected to the first pad VPP. The first terminal of the trigger resistor R is connected to the second terminal of the trigger capacitor C to form the trigger terminal NO of the trigger unit 101. The second terminal of the trigger resistor R is connected to the second pad VSS.

When there is an electrostatic pulse on the first pad VPP, impedance of the trigger capacitor C becomes smaller, a voltage at the trigger terminal NO of the trigger unit 101 is coupled to a voltage on the first pad VPP, a voltage at the control terminal NO of the discharge transistor M1 is also raised, and the discharge transistor M1 is turned on to discharge an electrostatic charge to the second pad VSS.

Figure 10:
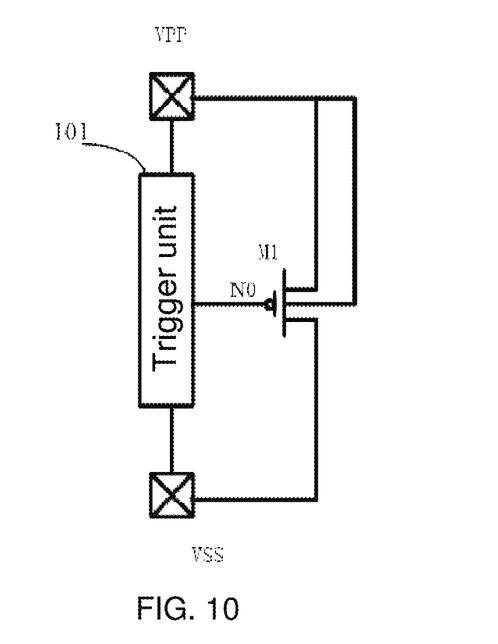
FIG. 10 is a specific circuit diagram of an ESD protection circuit according to another embodiment of the present disclosure.

FIG. 10 is a circuit diagram of an ESD protection circuit according to an embodiment of the present disclosure. As shown in FIG. 10, the ESD protection circuit provided in this embodiment of the present disclosure includes a trigger unit 101 and a discharge transistor M1, and the discharge transistor M1 is a P-type transistor.

A control terminal NO of the discharge transistor M1 is connected to a trigger terminal NO of the trigger unit 101. A first terminal of the discharge transistor M1 is connected to a first pad VPP. A second terminal of the discharge transistor M1 is connected to a second pad VSS. A substrate terminal of the discharge transistor M1 is connected to the first pad VPP, such that a voltage at the substrate terminal is pulled to a first voltage.

When there is an electrostatic pulse on the first pad VPP, a voltage at the trigger terminal NO of the trigger unit 101 is pulled down. Because the control terminal NO of the discharge transistor M1 is connected to the trigger terminal NO of the trigger unit 101, a voltage at the control terminal NO of the discharge transistor M1 is pulled down, such that the discharge transistor M1 is turned on and discharges an electrostatic pulse to the second pad VSS. In addition, because the substrate terminal of the discharge transistor M1 is connected to the first pad VPP, the voltage at the substrate terminal is raised to the first voltage. The voltage at the substrate terminal is increased to increase a voltage of a base of a parasite PNP transistor, making it difficult for the parasite PNP transistor to be turned on, thereby effectively reducing the risk of causing a latch-up effect.

Figure 11:
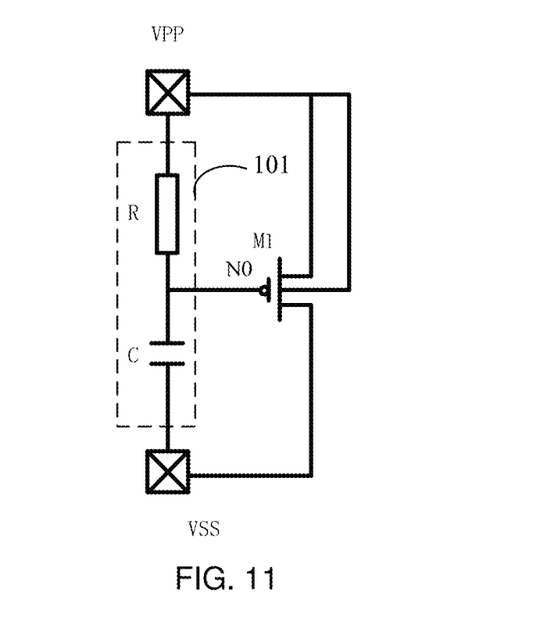
FIG. 11 is a specific circuit diagram of the ESD protection circuit according to the embodiment shown in FIG. 10.

In some embodiments, as shown in FIG. 11, the trigger unit 101 includes a trigger resistor R and a trigger capacitor C. The trigger resistor R and the trigger capacitor C are each provided with a first terminal and a second terminal. The first terminal of the trigger resistor R is connected to the first pad VPP. The first terminal of the trigger capacitor C is connected to the second terminal of the trigger resistor R to form the trigger terminal NO of the trigger unit 101. The second terminal of the trigger capacitor C is connected to the second pad VSS.

When there is an electrostatic pulse on the first pad VPP, impedance of the trigger capacitor C becomes smaller, the trigger terminal NO of the trigger unit 101 is coupled to a voltage on the second pad VSS, a voltage at the trigger terminal NO of the discharge transistor M1 is pulled down, and the discharge transistor M1 is turned on to discharge an electrostatic charge to the second pad VSS.

Figure 12:
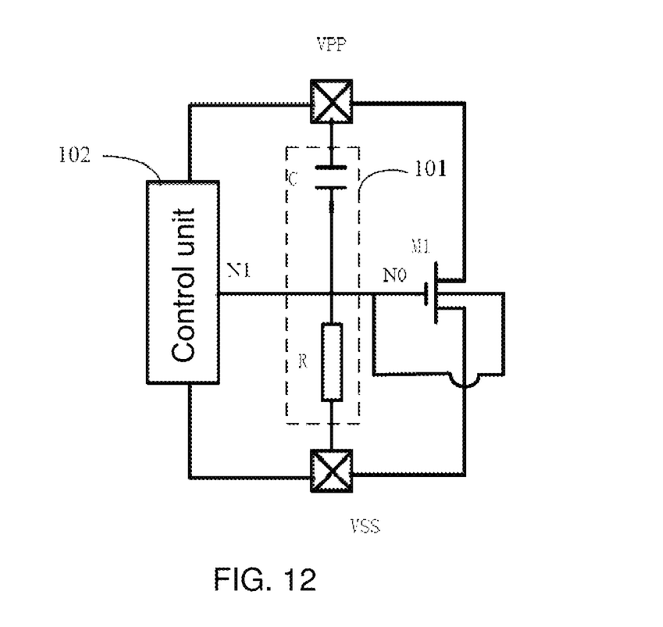
FIG. 12 is a specific circuit diagram of an ESD protection circuit according to another embodiment of the present disclosure.
Figure 14:
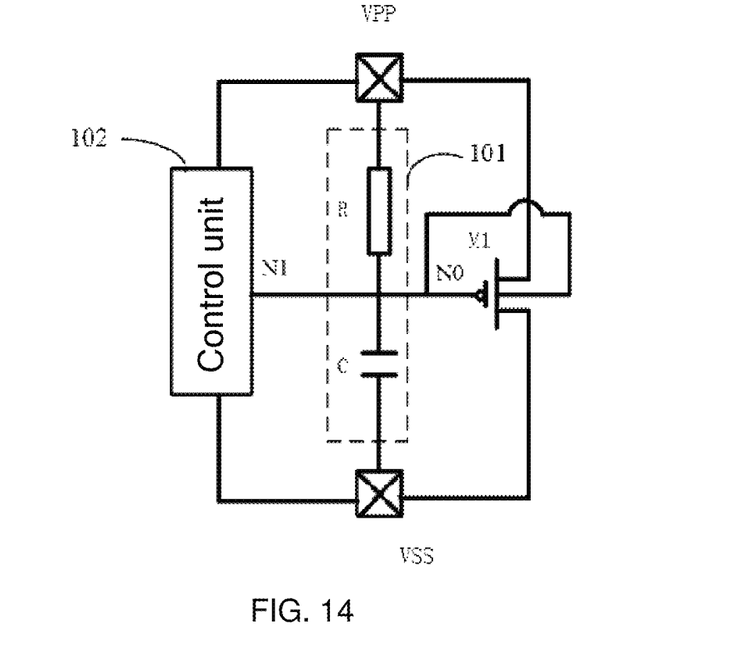
FIG. 14 is a specific circuit diagram of an ESD protection circuit according to another embodiment of the present disclosure.

FIG. 12 and FIG. 14 are each a circuit diagram of an ESD protection circuit according to an embodiment of the present disclosure. As shown in FIG. 12 and FIG. 14, the ESD protection circuit provided in this embodiment of the present disclosure includes a trigger unit 101, a discharge transistor M1, and a control unit 102.

The control unit 102 is provided with a control terminal N1. The control terminal N1 of the control unit 102 is connected to a trigger terminal NO of the trigger unit 101. The trigger terminal NO of the trigger unit 101 is connected to a control terminal NO of the discharge transistor M1. A substrate terminal of the discharge transistor M1 is connected to the control terminal NO of the discharge transistor M1.

When there is an electrostatic pulse on a first pad VPP, impedance of the trigger capacitor C becomes smaller. Because the trigger terminal NO of the trigger unit 101 is coupled to a voltage on a second pad VSS, a voltage at the trigger terminal NO of the trigger unit 101 is raised, and a voltage at the control terminal NO of the discharge transistor M1 is raised. In this way, the discharge transistor M1 is turned on to discharge an electrostatic charge to the second pad VSS. The control terminal N1 of the control unit 102 is connected to the control terminal NO of the discharge transistor M1. When the discharge transistor M1 discharges an electrostatic charge on the first pad VPP to the second pad VSS, the control unit 102 pulls a voltage at the substrate terminal of the discharge transistor M1 to a first voltage or a second voltage, such that the voltage at the control terminal of the discharge transistor M1 is lower than a turn-on voltage of the discharge transistor M1. In this way, the discharge transistor M1 is turned off quickly, preventing a parasitic transistor in the discharge transistor M1 from being turned on, thereby reducing the risk of causing a latch-up effect.

Figure 13:
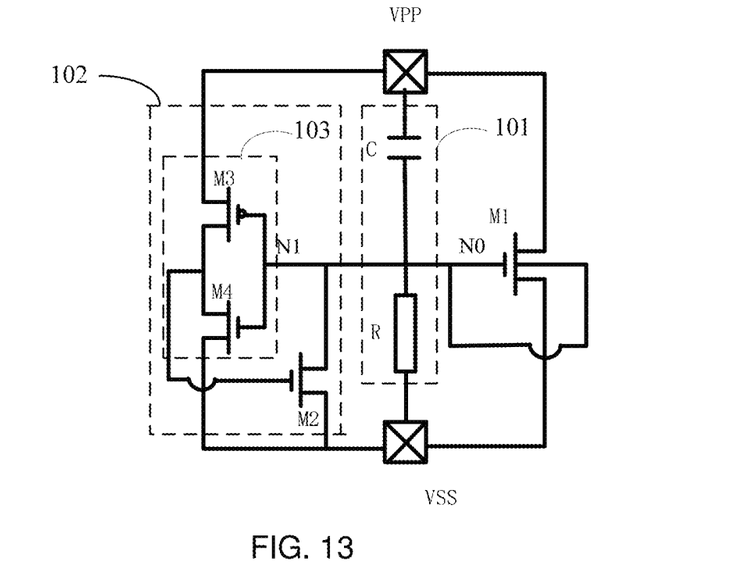
FIG. 13 is a specific circuit diagram of the ESD protection circuit according to the embodiment shown in FIG. 12.
Figure 15:
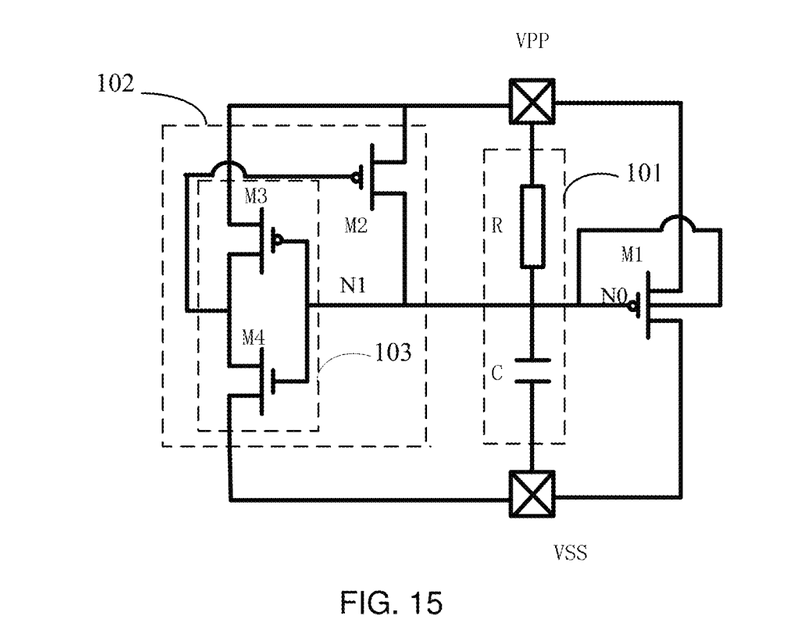
FIG. 15 is a specific circuit diagram of the ESD protection circuit according to the embodiment shown in FIG. 14.

In some embodiments, as shown in FIG. 13 and FIG. 15, the control unit 102 includes a protection transistor M2. A first terminal of the protection transistor M2 is connected to the first pad VPP or the second pad VSS. A second terminal of the protection transistor M2 is used as the control terminal of the control unit 102. When there is an electrostatic pulse on the first pad VPP, impedance of the trigger capacitor C becomes smaller. Because the trigger terminal NO of the trigger unit 101 is coupled to a voltage on the second pad VSS, a voltage at the trigger terminal NO of the trigger unit 101 is raised, a voltage at the control terminal NO of the discharge transistor M1 is raised, and the discharge transistor M1 is turned on to discharge an electrostatic charge to the second pad VSS. Subsequently, the protection transistor M2 is controlled to be turned on, and a voltage at the second terminal of the protection transistor M2 is pulled to the first voltage or the second voltage, such that the voltage at the control terminal of the discharge transistor M1 is pulled to the first voltage or the second voltage, that is, the voltage at the substrate terminal of the discharge transistor M1 is pulled to the first voltage or the second voltage. In this way, the voltage at the substrate terminal of the discharge transistor M1 is lower than the turn-on voltage of the discharge transistor M1, and therefore, the discharge transistor M1 cannot be turned on, thereby reducing the risk of causing a latch-up effect.

As shown in FIG. 13 and FIG. 15, the control unit 102 may further include an inverter 103. An input terminal of the inverter 103 is used as the control terminal of the control unit 102 and is connected to the second terminal of the protection transistor M2. An output terminal of the inverter 103 is connected to a control terminal of the protection transistor M2. When there is an electrostatic pulse on the first pad VPP, a voltage at the control terminal NO of the discharge transistor M1 is raised, and the discharge transistor M1 is turned on to discharge an electrostatic charge to the second pad VSS. Subsequently, the electrostatic pulse on the first pad VPP stops, the inverter 103 controls the protection transistor M2 to be turned on, and the voltage at the second terminal of the protection transistor M2 is pulled to the first voltage or the second voltage, such that the voltage at the control terminal of the discharge transistor M1 is pulled to the first voltage or the second voltage. Therefore, the voltage at the substrate terminal of the discharge transistor M1 is pulled to the first voltage or the second voltage, thereby preventing the discharge transistor M1 from being turned on.

As shown in FIG. 13, an ESD protection circuit provided in an embodiment of the present disclosure includes a trigger unit 101, a discharge transistor M1, and a control unit 102. The control unit 102 includes a protection transistor M2 and an inverter 103. The discharge transistor M1 and the protection transistor M2 are N-type transistors. A first terminal of the protection transistor M2 is connected to a second pad VSS. A second terminal of the protection transistor M2 is connected to a trigger terminal NO of the trigger unit 101. A control terminal of the protection transistor M2 is connected to an output terminal of the inverter 103. The trigger terminal NO of the trigger unit 101 is further connected to a control terminal of the discharge transistor M1. The control terminal of the discharge transistor M1 is further connected to a substrate terminal of the discharge transistor M1. A first terminal of the discharge transistor M1 is connected to a first pad VPP. A second terminal of the discharge transistor M1 is connected to the second pad VSS.

When there is an electrostatic pulse on the first pad VPP, a voltage at the trigger terminal NO of the trigger unit 101 is coupled to a voltage on the first pad VPP, a voltage at the trigger terminal NO of the discharge transistor M1 is raised, and the discharge transistor M1 is turned on. When the discharge transistor M1 discharges the electrostatic pulse on the first pad VPP to the second pad VSS, the inverter 103 controls the protection transistor M2 to be turned on, a voltage at the second terminal of the protection transistor M2 is coupled to a voltage on the second pad VSS, and the voltage at the second terminal of the protection transistor M2 is pulled down. In this case, the voltage at the control terminal of the discharge transistor M1 is pulled down, such that a voltage at the substrate terminal of the discharge transistor M1 is pulled down, preventing a parasite NPN transistor in the discharge transistor M1 from being turned on, thereby reducing the risk of causing a latch-up effect.

In some embodiments, as shown in FIG. 13, the inverter 103 includes a first transistor M3 and a second transistor M4. A control terminal of the first transistor M3 and a control terminal of the second transistor M4 are connected to the trigger terminal NO of the trigger unit 101 to form an input terminal of the inverter. A first terminal of the first transistor M3 is connected to the first pad VPP. A second terminal of the first transistor M3 is connected to a first terminal of the second transistor M4 to form the output terminal of the inverter 103. A second terminal of the second transistor M4 is connected to the second pad VSS.

The first transistor M3 is a P-type transistor. The second transistor M4 is an N-type transistor. When there is an electrostatic pulse on the first pad VPP, the voltage at the trigger terminal NO of the trigger unit 101 is coupled to the voltage on the first pad VPP, the voltage at the trigger terminal NO of the discharge transistor M1 is raised, and the discharge transistor M1 is turned on. The input terminal of the inverter 103 is connected to the trigger terminal NO of the trigger unit 101. When a voltage at the input terminal of the inverter 103 is raised, the second transistor M4 is turned on, and a voltage at the output terminal of the inverter 103 is coupled to the voltage on the second pad VSS, that is, the voltage at the control terminal of the protection transistor M2 is pulled down. When the voltage at the control terminal of the protection transistor M2 is lower than a turn-on voltage of the protection transistor M2, the protection transistor M2 is turned off, such that the electrostatic pulse on the first pad VPP is discharged to the second pad VSS through the discharge transistor M1. When the electrostatic pulse on the first pad VPP stops, the voltage at the trigger terminal NO of the trigger unit 101 is pulled down, the voltage at the input terminal of the inverter 103 is pulled down, the first transistor M3 is turned on, and the voltage at the output terminal of the inverter 103 is coupled to the voltage on the first pad VPP, that is, the voltage at the control terminal of the protection transistor M2 is raised. When the voltage at the control terminal of the protection transistor M2 is higher than the turn-on voltage of the protection transistor M2, the protection transistor M2 is turned on, the voltage at the second terminal of the protection transistor M2 is coupled to the voltage on the second pad VSS, and the voltage at the trigger terminal NO of the discharge transistor M1 is pulled down, that is, the voltage at the substrate terminal of the discharge transistor M1 is pulled down, preventing the parasite NPN transistor in the discharge transistor M1 from being turned on, thereby reducing the risk of causing a latch-up effect.

As shown in FIG. 15, an ESD protection circuit provided in an embodiment of the present disclosure includes a trigger unit 101, a discharge transistor M1, and a control unit 102. The control unit 102 includes a protection transistor M2 and an inverter 103. The discharge transistor M1 and the protection transistor M2 are P-type transistors.

A first terminal of the protection transistor M2 is connected to a first pad VPP. A second terminal of the protection transistor M2 is connected to a trigger terminal NO of the trigger unit 101. A control terminal of the protection transistor M2 is connected to an output terminal of the inverter 103. The trigger terminal NO of the trigger unit 101 is further connected to a control terminal of the discharge transistor M1. The control terminal of the discharge transistor M1 is further connected to a substrate terminal of the discharge transistor M1. A first terminal of the discharge transistor M1 is connected to the first pad VPP. A second terminal of the discharge transistor M1 is connected to a second pad VSS.

When there is an electrostatic pulse on the first pad VPP, a voltage at the trigger terminal NO of the trigger unit 101 is coupled to a voltage on the second pad VSS, a voltage at the trigger terminal NO of the discharge transistor M1 is pulled down, and the discharge transistor M1 is turned on. When the discharge transistor M1 discharges the electrostatic pulse on the first pad VPP to the second pad VSS, the inverter 103 controls the protection transistor M2 to be turned on, a voltage at the second terminal of the protection transistor M2 is coupled to a voltage on the first pad VPP, and the voltage at the second terminal of the protection transistor M2 is raised. In this case, the voltage at the control terminal of the discharge transistor M1 is raised, such that a voltage at the substrate terminal of the discharge transistor M1 is raised, preventing a parasite PNP transistor in the discharge transistor M1 from being turned on, thereby reducing the risk of causing a latch-up effect.

When there is an electrostatic pulse on the first pad VPP, a voltage at the trigger terminal NO of the trigger unit 101 is coupled to a voltage on the second pad VSS, a voltage at the trigger terminal NO of the discharge transistor M1 is pulled down, and the discharge transistor M1 is turned on. An input terminal of the inverter 103 is connected to the trigger terminal NO of the trigger unit 101. When a voltage at the input terminal of the inverter 103 is pulled down, a first transistor M3 is turned on, a voltage at the output terminal of the inverter 103 is coupled to the voltage on the first pad VPP, that is, a voltage at the control terminal of the protection transistor M2 is raised, and the protection transistor M2 is turned off, such that the electrostatic pulse on the first pad VPP is discharged to the second pad VSS through the discharge transistor M1. When the electrostatic pulse on the first pad VPP stops, the voltage at the trigger terminal NO of the trigger unit 101 is raised, the voltage at the input terminal of the inverter 103 is raised, a second transistor M4 is turned, and the voltage at the output terminal of the inverter 103 is coupled to the voltage on the second pad VSS, that is, the voltage at the control terminal of the protection transistor M2 is pulled down, and the protection transistor M2 is turned on. In this case, the voltage at the second terminal of the protection transistor M2 is coupled to the voltage on the first pad VPP, and the voltage at the trigger terminal NO of the discharge transistor M1 is raised, that is, the voltage at the substrate terminal of the discharge transistor M1 is raised, preventing the parasite PNP transistor in the discharge transistor M1 from being turned on, thereby reducing the risk of causing a latch-up effect.

Figure 16:
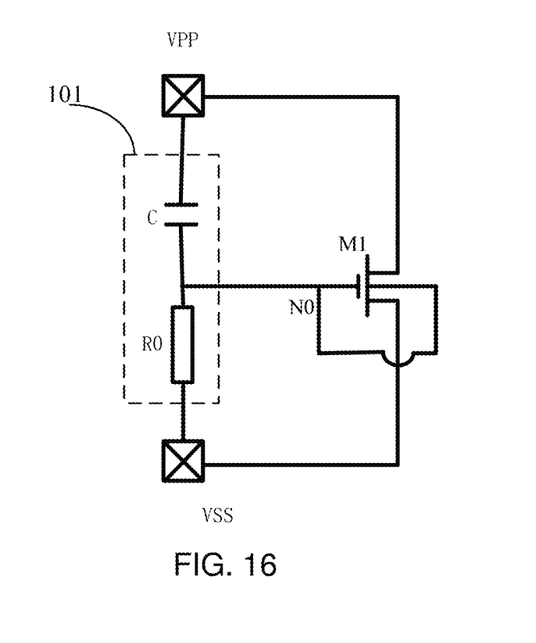
FIG. 16 is a specific circuit diagram of an ESD protection circuit according to another embodiment of the present disclosure.

An embodiment of the present disclosure further provides an ESD protection circuit. Referring to FIG. 16, the ESD protection circuit includes a trigger unit 101 and a discharge transistor M1. The trigger unit 101 includes a trigger capacitor C and a trigger resistor RO. A first terminal of the trigger capacitor C is connected to a first pad VPP. A second terminal of the trigger capacitor is connected to a first terminal of the trigger resistor RO to form a trigger terminal NO of the trigger unit 101. The trigger terminal NO of the trigger unit 101 is connected to a control terminal of the discharge transistor M1. The control terminal of the discharge transistor M1 is connected to a substrate terminal of the discharge transistor M1. A first terminal of the discharge transistor M1 is connected to the first pad VPP. A second terminal of the discharge transistor M1 is connected to a second pad VSS.

A resistance value of the trigger resistor RO is lower than that of the trigger resistor R in the foregoing other embodiments. For example, RO=1/3R. When the resistance value of the trigger resistor RO decreases, a voltage at the control terminal NO of the discharge transistor M1 decreases, such that a voltage at the substrate terminal of the discharge transistor M1 decreases, preventing a parasite NPN transistor in the discharge transistor M1 from being turned on, thereby reducing the risk of causing a latch-up effect.

In the foregoing technical solution, the ESD protection circuit includes a trigger unit and a discharge transistor. The trigger unit is connected between a first pad and a second pad, provided with a trigger terminal, and configured to generate a trigger signal when there is an electrostatic pulse on the first pad. The first pad is connected to a first voltage. The second pad is connected to a second voltage. The first voltage is greater than the second voltage. The discharge transistor has a first terminal connected to the first pad, and a second terminal connected to the second pad, and discharges an electrostatic charge to the second pad when triggered by the trigger signal. When there is an electrostatic pulse on the first pad, a voltage at a substrate terminal of the discharge transistor is also raised. Therefore, the voltage at the substrate terminal of the discharge transistor is pulled to the first voltage or the second voltage, to prevent a parasitic transistor at the substrate terminal of the discharge transistor from being turned on, such that the risk of causing a latch-up effect in the ESD protection circuit is reduced and reliability is higher.

The invention claimed is:

1. An electrostatic discharge protection circuit, a chip comprising a first pad and a second pad, wherein the electrostatic discharge protection circuit comprises:

a trigger unit, connected between the first pad and the second pad, provided with a trigger terminal, and configured to generate a trigger signal when there is an electrostatic pulse on the first pad, wherein the first pad is connected to a first voltage, the second pad is connected to a second voltage, and the first voltage is greater than the second voltage;

a discharge transistor, having a control terminal connected to the trigger terminal, a first terminal connected to the first pad, a second terminal connected to the second pad, and a substrate terminal connected to the control terminal of the discharge transistor, and the discharge transistor configured to discharge an electrostatic charge to the second pad when triggered by the trigger signal, to pull a voltage at the substrate terminal of the discharge transistor to the first voltage or the second voltage; and a control unit, provided with a control terminal connected to the trigger terminal of the trigger unit; the control unit comprising a protection transistor and an inverter, the protection transistor provided with a control terminal, a first terminal and a second terminal, an input terminal of the inverter used as the control terminal of the control unit, an output terminal of the inverter connected to the control terminal of the protection transistor;

wherein,
the discharge transistor and the protection transistor are both N-type transistors, the first terminal of the protection transistor different from the control terminal of the protection transistor is connected to the trigger terminal, and the second terminal of the protection transistor is connected to the second pad, or the discharge transistor and the protection transistor are both P-type transistors, the first terminal of the protection transistor different from the control terminal of the protection transistor is connected to the trigger terminal, and the second terminal of the protection transistor is connected to the first pad.

2. The electrostatic discharge protection circuit according to claim 1, wherein the discharge transistor and the protection transistor are both the N-type transistors, and the trigger unit comprises:
   a trigger capacitor, provided with a first terminal and a second terminal, wherein the first terminal of the trigger capacitor is connected to the first pad; and
   a trigger resistor, provided with a first terminal and a second terminal, wherein the first terminal of the trigger resistor is connected to the second terminal of the trigger capacitor to form the trigger terminal of the trigger unit, and the second terminal of the trigger resistor is connected to the second pad.

3. The electrostatic discharge protection circuit according to claim 1, wherein the discharge transistor and the protection transistor are both the P-type transistors, and the trigger unit comprises:
   a trigger resistor, provided with a first terminal and a second terminal, wherein the first terminal of the trigger resistor is connected to the first pad; and
   a trigger capacitor, provided with a first terminal and a second terminal, wherein the first terminal of the trigger capacitor is connected to the second terminal of the trigger resistor to form the trigger terminal of the trigger unit, and the second terminal of the trigger capacitor is connected to the second pad.

4. The electrostatic discharge protection circuit according to claim 1,
   wherein
   the control unit is configured to pull the voltage at the substrate terminal of the discharge transistor to the first voltage or the second voltage when the discharge transistor discharges the electrostatic charge to the second pad.

5. The electrostatic discharge protection circuit according to claim 4,
   wherein
   the protection transistor is configured to be turned on when the discharge transistor discharges the electrostatic charge to the second pad, such that the voltage at the substrate terminal is pulled to the first voltage or the second voltage.

6. The electrostatic discharge protection circuit according to claim 5, wherein the inverter is configured to: when the discharge transistor discharges the electrostatic charge to the second pad, control the protection transistor to be turned on, such that the voltage at the substrate terminal is pulled to the first voltage or the second voltage.

7. The electrostatic discharge protection circuit according to claim 6, wherein the inverter comprises a first transistor and a second transistor;
   a control terminal of the first transistor and a control terminal of the second transistor are connected to the trigger terminal to form the input terminal of the inverter;
   a first terminal of the first transistor is connected to the first pad, and a second terminal of the first transistor is connected to a first terminal of the second transistor to form the output terminal of the inverter; and
   a second terminal of the second transistor is connected to the second pad.

8. The electrostatic discharge protection circuit according to claim 7, wherein the first transistor is a P-type transistor, and the second transistor is an N-type transistor.

9. The electrostatic discharge protection circuit according to claim 1, further comprising:
   an input unit, connected to the first pad, and configured to provide the first voltage.

\* \* \* \* \*